(12) United States Patent
Hayahi

(10) Patent No.: US 11,194,367 B2
(45) Date of Patent: Dec. 7, 2021

(54) FOLDABLE DEVICE AND METHOD FOR DISPOSING FLEXIBLE CABLE

(71) Applicant: NEC Platforms, Ltd., Kawasaki (JP)

(72) Inventor: Manabu Hayahi, Kanagawa (JP)

(73) Assignee: NEC Platforms, Ltd., Kanagawa (JP)

( * ) Notice: Subject to any disclaimer, the term of this patent is extended or adjusted under 35 U.S.C. 154(b) by 54 days.

(21) Appl. No.: 16/621,755

(22) PCT Filed: Jun. 13, 2018

(86) PCT No.: PCT/JP2018/022566
§ 371 (c)(1),
(2) Date: Dec. 12, 2019

(87) PCT Pub. No.: WO2018/235694
PCT Pub. Date: Dec. 27, 2018

(65) Prior Publication Data
US 2020/0146164 A1    May 7, 2020

(30) Foreign Application Priority Data
Jun. 21, 2017    (JP) .............................. JP2017-121104

(51) Int. Cl.
*G06F 1/16* (2006.01)
*H05K 5/02* (2006.01)
*H04M 1/02* (2006.01)

(52) U.S. Cl.
CPC .......... *G06F 1/1683* (2013.01); *G06F 1/1681* (2013.01); *H05K 5/0226* (2013.01); *H05K 5/0247* (2013.01); *E05Y 2900/606* (2013.01); *G06F 1/1616* (2013.01); *H04M 1/0214* (2013.01)

(58) Field of Classification Search
CPC .... H04M 1/0214; H04M 1/0216; H04M 1/18; E05D 11/0081; E05D 11/0054; E05Y 2900/606; G06F 1/1616; G06F 1/1681; G06F 1/1683; H02G 15/013; H01B 7/04; H05K 5/069; H05K 5/0226; H05K 5/0247
See application file for complete search history.

(56) References Cited

U.S. PATENT DOCUMENTS 7,466,558 B2 * 12/2008 Yasuda ............... H04M 1/0216
                                                                    361/752
2006/0160585 A1 * 7/2006 Miyagawa .............. H04M 1/18
                                                                    455/575.7

FOREIGN PATENT DOCUMENTS

| JP | 2004-207062 A | 7/2004 |
| JP | 2004-207446 A | 7/2004 |
| JP | 2005-269531 A | 9/2005 |

(Continued)

OTHER PUBLICATIONS

International Search Report for PCT Application No. PCT/JP2018/022566, dated Aug. 28, 2018.

(Continued)

*Primary Examiner* — James Wu
(74) *Attorney, Agent, or Firm* — Sughrue Mion, PLLC

(57) ABSTRACT

In the foldable device according to the present invention, the inner wall surface of a hinge section forms a part of the side surface of a columnar space that has a cross-section having an arc with a radius R0. When a first unit and a second unit are connected to each other in an open state by means of the hinge section, a flexible cable forms an arc with a radius R1 that is substantially equal to the radius R0.

12 Claims, 14 Drawing Sheets

(56) References Cited

FOREIGN PATENT DOCUMENTS

| | | | | |
|---|---|---|---|---|
| JP | 2005-347345 | A | | 12/2005 |
| JP | 2006-041139 | A | | 2/2006 |
| JP | 2006041139 | A | * | 4/2006 |
| JP | 2007-053718 | A | | 3/2007 |
| JP | 2007-067506 | A | | 3/2007 |
| JP | 2007067506 | A | * | 3/2007 |
| JP | 2008-289103 | A | | 11/2008 |
| JP | 2009-003649 | A | | 1/2009 |
| JP | 2009003649 | A | * | 1/2009 |
| JP | 2012-034206 | A | | 2/2012 |

OTHER PUBLICATIONS

English translation of Written opinion for PCT Application No. PCT/JP2018/022566.
Japanese Office Action for JP Application No. 2018-244799 dated Feb. 6, 2019 with English Translation.

\* cited by examiner

FOLDABLE DEVICE AND METHOD FOR DISPOSING FLEXIBLE CABLE

This application is a National Stage Entry of PCT/JP2018/022566 filed on Jun. 13, 2018, which claims priority from Japanese Patent Application 2017-121104 filed on Jun. 21, 2017, the contents of all of which are incorporated herein by reference, in their entirety.

TECHNICAL FIELD

This invention relates to a foldable device including a first unit and a second unit which are foldably connected to each other via a hinge portion and, in particular, to a flexible cable adapted to electrically connect the first unit and the second unit.

BACKGROUND ART

As examples of the foldable device, there are a handy terminal, a laptop computer, and a mobile telephone terminal. The handy terminal is a terminal of a POS (Point Of Sales) system and, for example, is a mobile terminal device to be used by a shop staff member to enter an order of a customer in a family-oriented restaurant.

There is a type of handy terminal in which a first unit having an operation surface and a second unit having an operation surface are rotatably connected to each other via a hinge portion. The handy terminal of the type is openable and closeable to be put into an open state in which the first unit and the second unit are spread and a closed state in which the first unit and the second unit are closed to face each other. Generally, the first unit and the second unit have circuit devices mounted inside their housings, respectively, and are electrically connected to each other via a cable.

As the cable connecting the first unit and the second unit, a flexible cable may be used. In this case, the flexible cable is wound and received in the hinge portion in some handy terminals. Patent Document 1 describes one example of a mobile terminal device related to a handy terminal of the type.

Referring to FIG. 18, a mobile terminal device 80 disclosed in Patent Document 1 is illustrated. The mobile terminal device 80 illustrated in the figure has a first unit 81, a second unit 82, a hinge portion 83, and a flexible cable 84 contained in the hinge portion 83. The flexible cable 84 is not fixed to the hinge portion 83. Specifically, the flexible cable 84 is displaceable and movable at inlet ports 85 and 86 of the hinge portion 83. In other words, the mobile terminal device 80 illustrated in the figure does not have a structure which provides a waterproof property or a dustproof property to insides of the first unit 81 and the second unit 82.

PRIOR ART DOCUMENT(S)

Patent Document(s)

Patent Document 1: JP 2005-347345 A

SUMMARY OF THE INVENTION

Problem to be Solved by the Invention

In order to achieve the structure having the waterproof property or the dustproof property, it is proposed to close the inlet ports 85 and 86 and fix the flexible cable 84. However, if the flexible cable 84 is fixed at the inlet ports 85 and 86, the flexible cable 84 may possibly be broken when the mobile terminal device 80 is repeatedly opened and closed.

In view of the above-mentioned circumstance, this invention has been made. A problem to be solved by this invention is to provide a foldable device in which breakage of a flexible cable due to repetition of opening and closing is difficult to occur even if the flexible cable is fixed at an inlet port to at least one of a first unit and a second unit.

Means to Solve the Problem

In order to solve the above-mentioned problem, this invention provides, as one aspect thereof, a foldable device comprising a first unit, a second unit, a hinge portion, and a flexible cable, wherein the hinge portion rotatably connects the first unit and the second unit and the flexible cable electrically connects the first unit and the second unit; at least a part of an inner wall surface of the hinge portion forms a part of a side surface of a columnar space having a section forming an arc of a radius $R0$; and the flexible cable forms an arc having a radius $R1$ substantially equal to the radius $R0$ when the first unit and the second unit are connected via the hinge portion in an open state.

Also, this invention provides, as another aspect, a method of disposing a flexible cable in a foldable device comprising a first unit, a second unit, a hinge portion, and a flexible cable, wherein the hinge portion rotatably connects the first unit and the second unit and the flexible cable electrically connects the first unit and the second unit. The method includes a stage in which at least a part of an inner wall surface of the hinge portion forms a part of a side surface of a columnar space having a section forming an arc of a radius $R0$; and a stage in which the flexible cable forms an arc having a radius $R1$ substantially equal to the radius $R0$ when the first unit and the second unit are connected via the hinge portion in an open state.

Effect of the Invention

According to this invention, it is possible to provide a foldable device in which breakage of a flexible cable due to repetition of opening and closing is difficult to occur even if the flexible cable is fixed at an inlet port to at least one of a first unit and a second unit.

MODE FOR EMBODYING THE INVENTION

Figure 1:
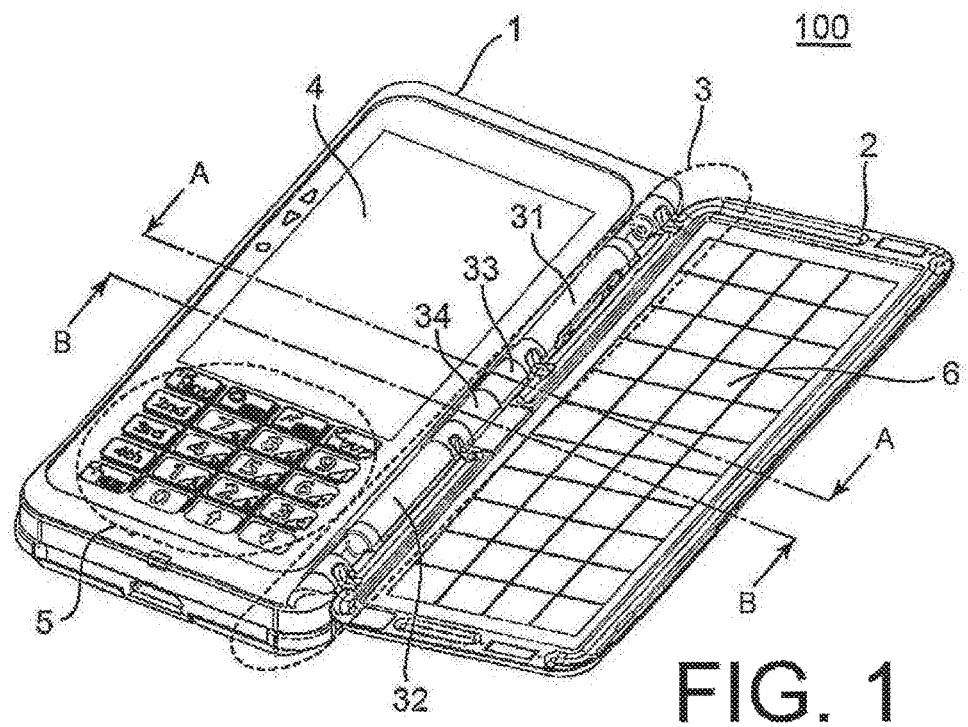
FIG. 1 is a perspective view of a handy terminal 100 according to one embodiment of this invention, and is a perspective view for describing a state where a first unit 1 and a second unit 2 are opened.
Figure 2:
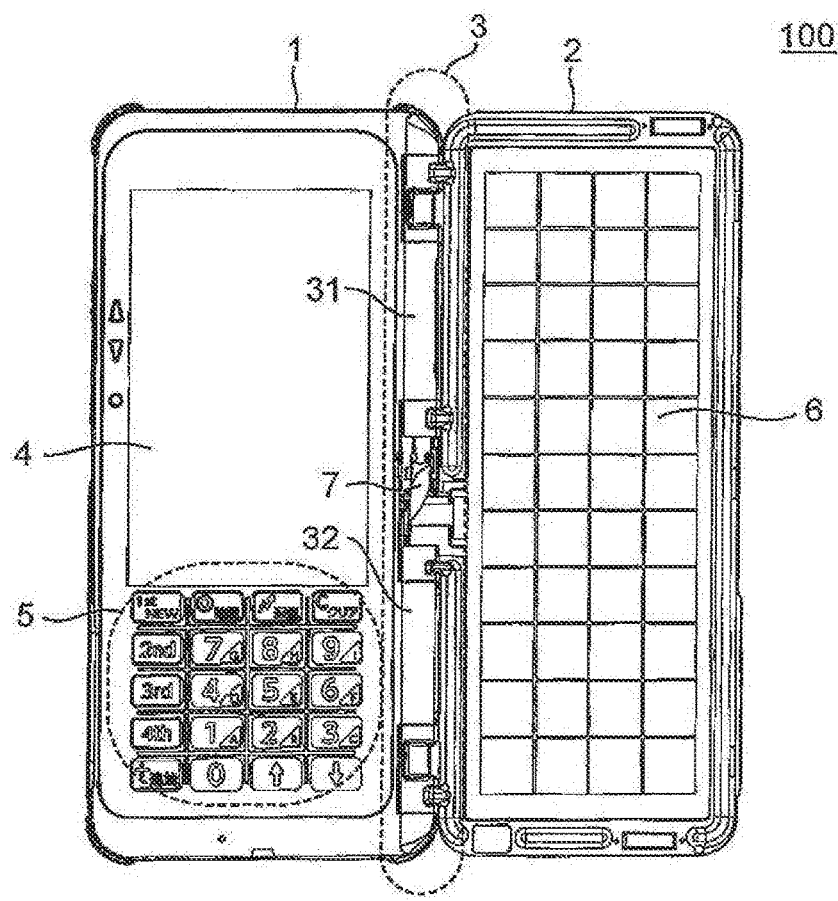
FIG. 2 is a plan view of the handy terminal 100, and is a plan view for describing a state where the first unit 1 and the second unit 2 are opened and covers 33 and 34 are removed.

Referring to FIGS. 1 and 2, a handy terminal 100 according to one embodiment of this invention will be described. The handy terminal 100 is a mobile terminal device for an order entry system used in a restaurant or the like and, for example, is used when a shop staff member enters an order of a customer. However, this invention is not limited to the mobile terminal device for an order entry system but is applicable to other electronic apparatuses having a foldable structure, for example, a laptop computer or the like.

The handy terminal 100 illustrated in the figure has two units comprising a first unit 1 and a second unit 2 and rotatably connected to each other via a hinge portion 3. By rotation at the hinge portion 3, the first unit 1 and the second unit 2 may be opened to a predetermined maximum angle from a state where their respective one surfaces are faced to each other, i.e., a closed state. The maximum angle is, for example, 170 degrees or 180 degrees but may be a smaller angle or a greater angle than those angles.

The first unit 1 has a circuit board (not shown) mounted with a control portion for controlling a whole of the device, a touch panel display 4, a key input portion 5, and so on.

The second unit 2 has a key input portion 6 comprising a membrane switch, and so on. As the key input portion 6, other contact points, for example, a touch panel may be used instead of the membrane switch.

The hinge portion 3 has hinges 31 and 32, and covers 33 and 34 between the hinge 31 and the hinge 32. The covers 33 and 34 have a shape obtained by partly cutting a side surface of a hollow cylinder along an axial direction.

Figure 3:
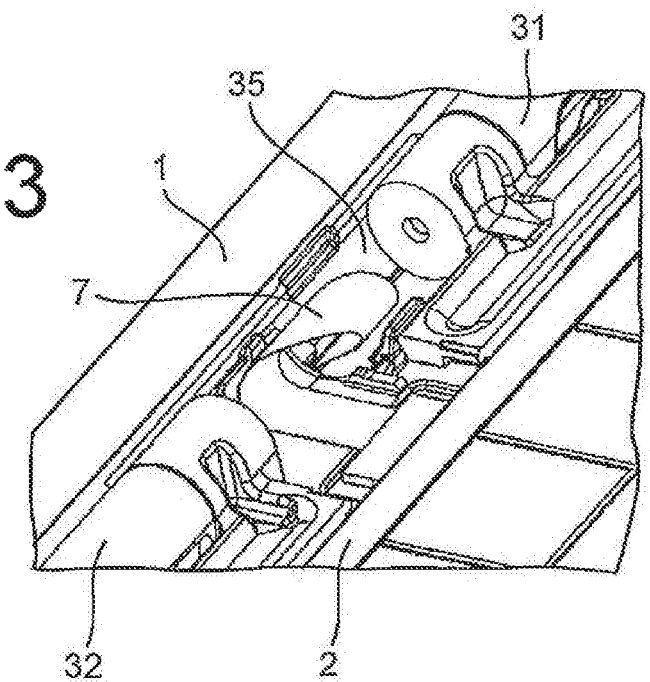
FIG. 3 is a partial enlarged view of FIG. 1 and is a perspective view for describing a winding portion 35 in the state where the covers 33 and 34 are removed.
Figure 4:
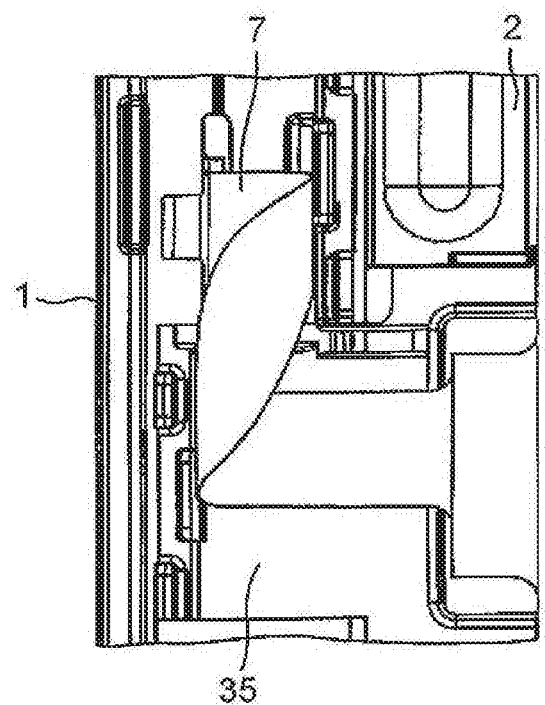
FIG. 4 is a partial enlarged view of FIG. 2, and is a plan view for describing the winding portion 35 in the state where the covers 33 and 34 are removed.

The covers 33 and 34 are removable. As shown in FIGS. 3 and 4, when the covers 33 and 34 are removed, a winding portion 35 is provided which is a generally columnar space along an axis of the hinge portion 3. The first unit 1 and the second unit 2 are electrically connected via a flexible cable 7. The flexible cable 7 extending from the second unit 2 is wound in the winding portion 35 and thereafter connected to the first unit 1.

Figure 5:
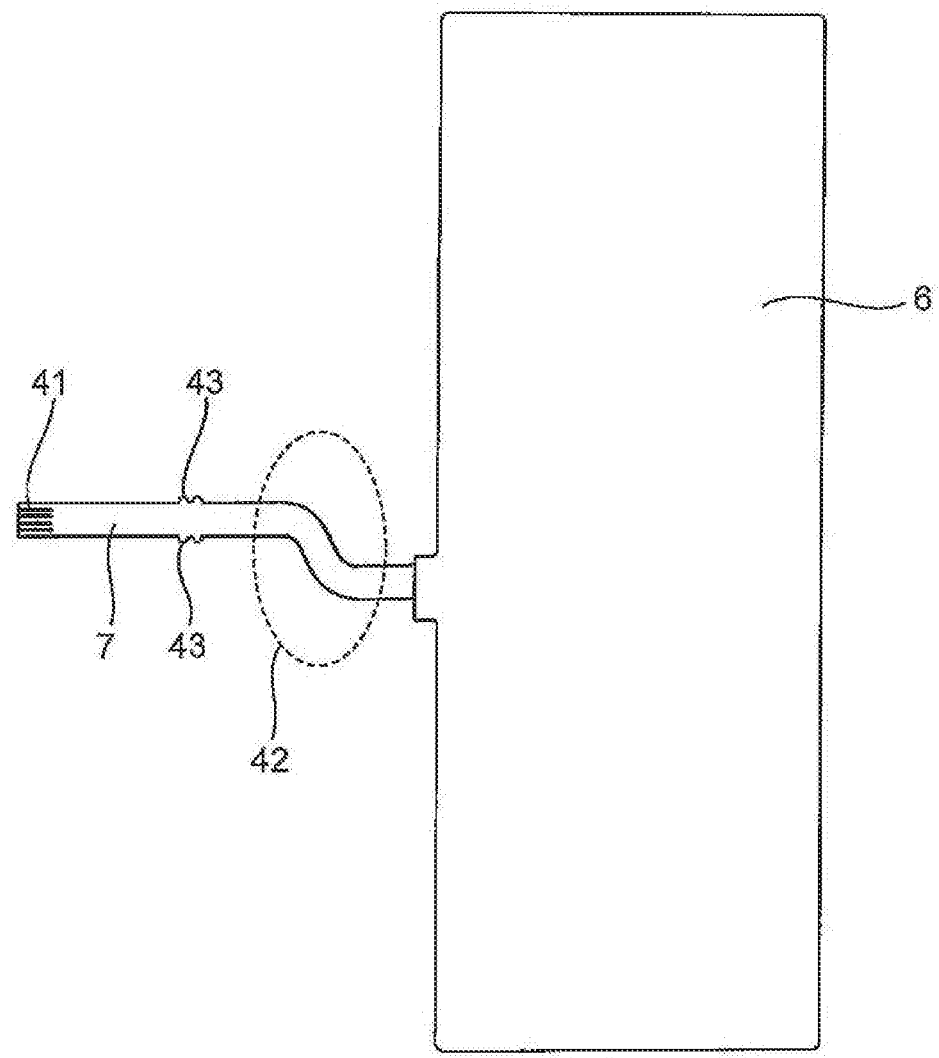
FIG. 5 is a plan view for describing a flexible cable 7.

Referring to FIG. 5, the flexible cable 7 will be described. The flexible cable 7 has a left end provided with a terminal portion 41 removably connectable to a connector of the circuit board of the first unit 1. The flexible cable 7 has an inverted S-shaped portion 42 formed at its intermediate part and having an inverted S shape obtained by inverting a letter "S" (an S shape when seen from a back surface). The inverted S-shaped portion 42 corresponds to a part wound in the winding portion 35. Positioning portions 43 are formed between the terminal portion 41 and the inverted S-shaped portion 42. The positioning portions 43 have a U shape opened in a direction perpendicular to a longitudinal direction of the cable.

The flexible cable 7 has a right end electrically connected to the key input portion 6 comprising a membrane switch, a touch panel, or the like. The key input portion 6 is subjected to waterproofing. Specifically, a whole of an input device such as the membrane switch, the touch panel, or the line is sealed with a resin material.

Description will be made of mounting of the flexible cable 7 to the first unit 1, the second unit 2, and the hinge portion 3.

As shown in FIGS. 1 and 2, the key input portion 6 of the flexible cable 7 is preliminarily fixed to a housing of the second unit 2. The fixation is carried out, for example, by receiving a part or a whole of a profile of the key input portion 6 sealed with the resin material in a recessed portion (not shown) formed in the housing of the second unit 2. By fixing the key input portion 6 with respect to the second unit 2, an entry length of the flexible cable 7 into the second unit 2 is defined.

Figure 6:
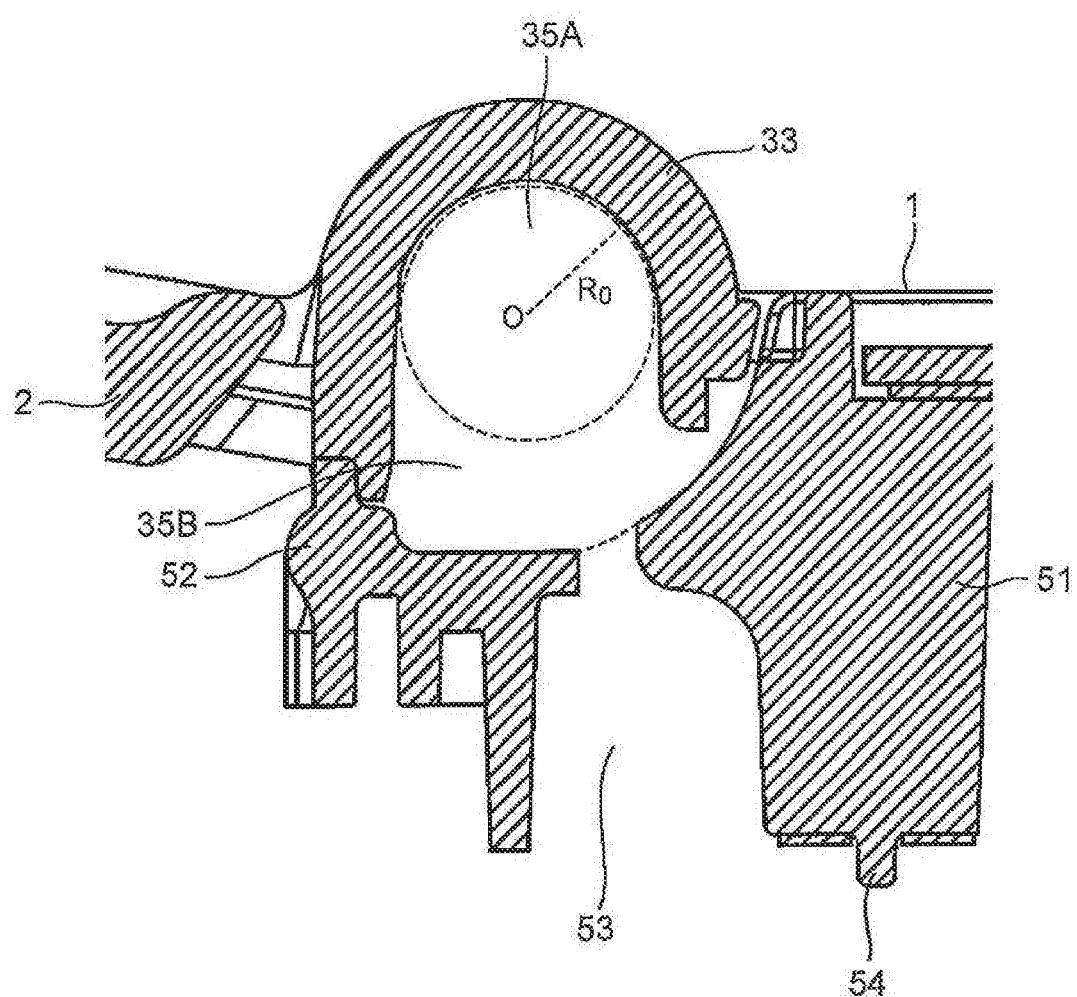
FIG. 6 is a sectional view, taken along a line A-A in FIG. 1, for describing mounting of the flexible cable 7 to the first unit 1, the second unit 2, and a hinge portion 3, and is a view for describing a state before the flexible cable 7 is inserted into the hinge portion 3.

As described above, the flexible cable 7 is preliminarily fixed to the second unit 2 and thereafter fixed to the first unit 1. It is assumed here that the first unit 1 and the second unit 2 are opened to the maximum at the hinge portion 3. As shown in FIG. 6, spaces 35A, 35B and 53 surrounded by the cover 33, a housing 51, and a hinge bottom portion 52 are formed. The space 35A is a cylindrical space formed along an inner wall surface of the cover 33. The inner wall surface of the cover 33 has a cross-section forming a half circle of a radius R0. The space 35B is a space surrounded by the space 35A, the housing 51, and the hinge bottom portion 52. The space 35A and the space 35B define the winding portion 35. The housing 51 is a housing of the first unit 1. The hinge bottom portion 52 is a part of the housing 51 and a part of the hinge portion 3. The space 53 is a space below the space 35B and between the housing 51 and the hinge bottom portion 52. As will later be described, the space 53 is a space for a press-fit portion 55 to be press-fitted therein.

Figure 7:
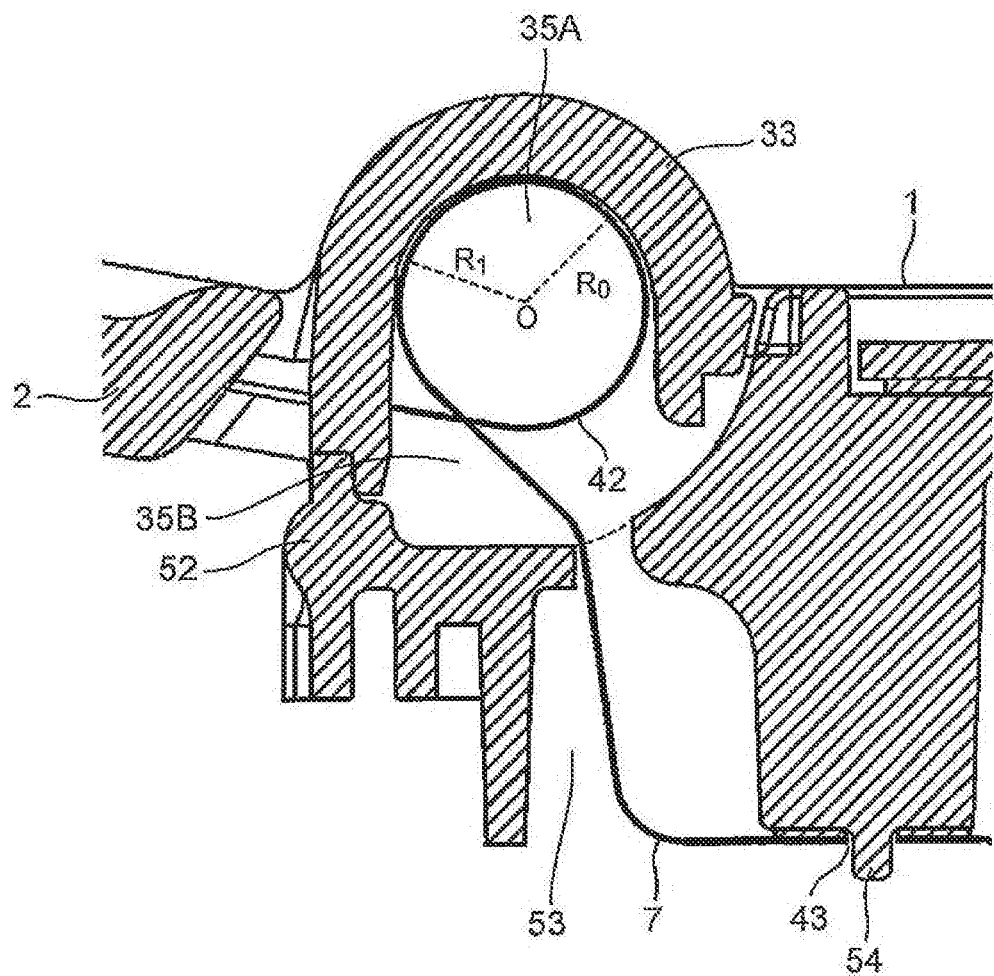
FIG. 7 is a sectional view, taken along the line A-A in FIG. 1, for describing mounting of the flexible cable 7 to the first unit 1, the second unit 2, and the hinge portion 3, and is a view for describing a state after the flexible cable 7 is inserted into the hinge portion 3 and before a press-fit portion 55 is press-fitted into a space 53.

The terminal portion 41 of the flexible cable 7 is inserted into the winding portion 35 (the spaces 35A and 35B) and the space 53. As shown in FIG. 7, in the space 35A, the inverted S-shaped portion 42 is bent so as to draw an arc along the inner wall surface of the cover 33. The arc drawn by the inverted S-shaped portion 42 has a radius R1 which is substantially equal to or slightly shorter than the radius R0 of the arc formed by the cross-section of the inner wall surface of the cover 33.

As shown in FIG. 7, when the handy terminal 100 is opened, the arc formed by the cross-section of the inner wall surface of the cover 33 is parallel to a generally semicircular portion, which corresponds to an upper half in the figure, of the generally circular arc formed by the flexible cable 7. Specifically, in FIG. 7, the inverted S-shaped portion 42 of the flexible cable 7 forms a sector shape having a center angle of 180 degrees along the approximate half circle of the radius R0 formed by the cross-section of the inner surface of the cover 33. However, the center angle of each of the arc formed by the cross-section of the inner wall surface of the cover 33 and the center angle of the arc drawn by the inverted S-shaped portion 42 and formed along the above-mentioned arc need not be equal to 180 degrees.

The terminal portion 41 passing through the spaces 35B and 53 is disposed along a lower part of the first unit 1. At this time, the U shape of each positioning portion 43 is fitted to a protrusion 54. By the fitting, an entry length of the flexible cable 7 into the first unit 1 is defined.

Figure 8:
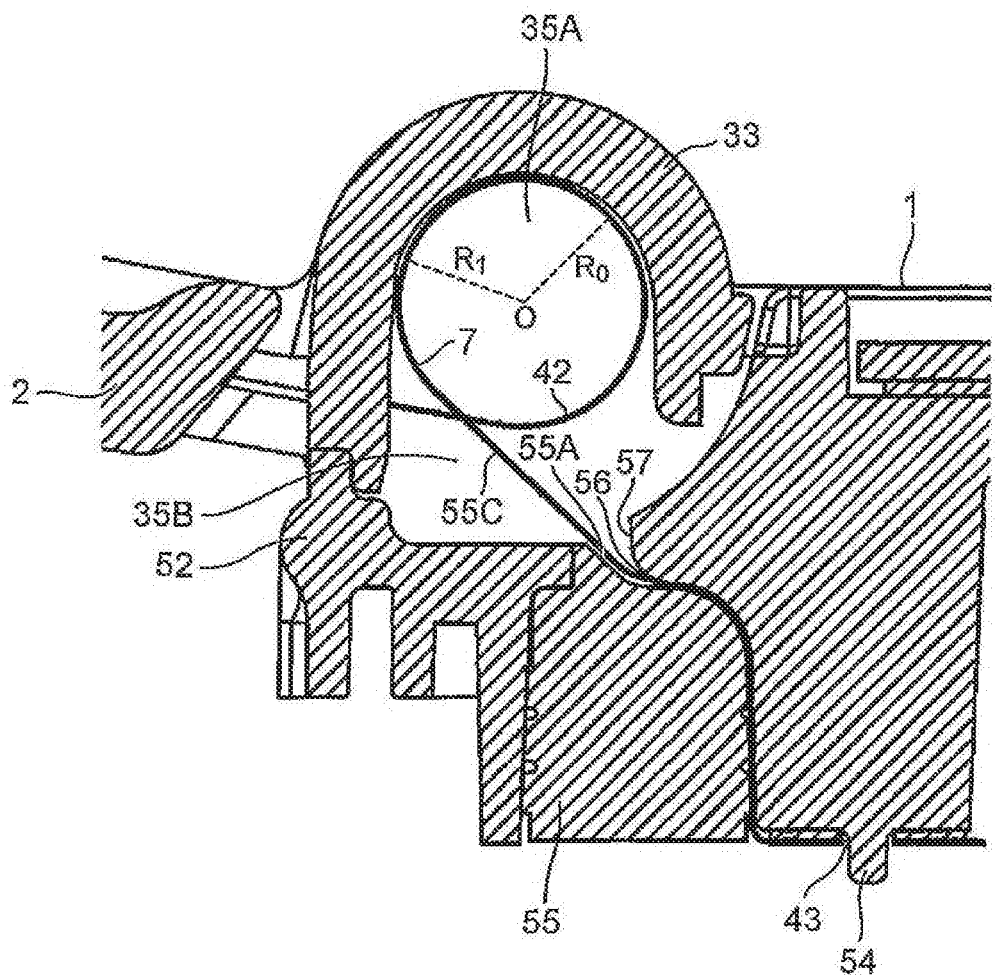
FIG. 8 is a sectional view, taken along the line A-A in FIG. 1, for describing mounting of the flexible cable 7 to the first unit 1, the second unit 2, and the hinge portion 3, and is a view for describing a state after the flexible cable 7 is inserted into the hinge portion 3 and after the press-fit portion 55 is press-fitted into the space 53.

From the above-mentioned state, the press-fit portion 55 is press-fitted into the space 53 as shown in FIG. 8. The press-fit portion 55 is a component having a shape as illustrated in FIGS. 9 and 10 and made of an elastic material, for example, rubber.

Figure 11:
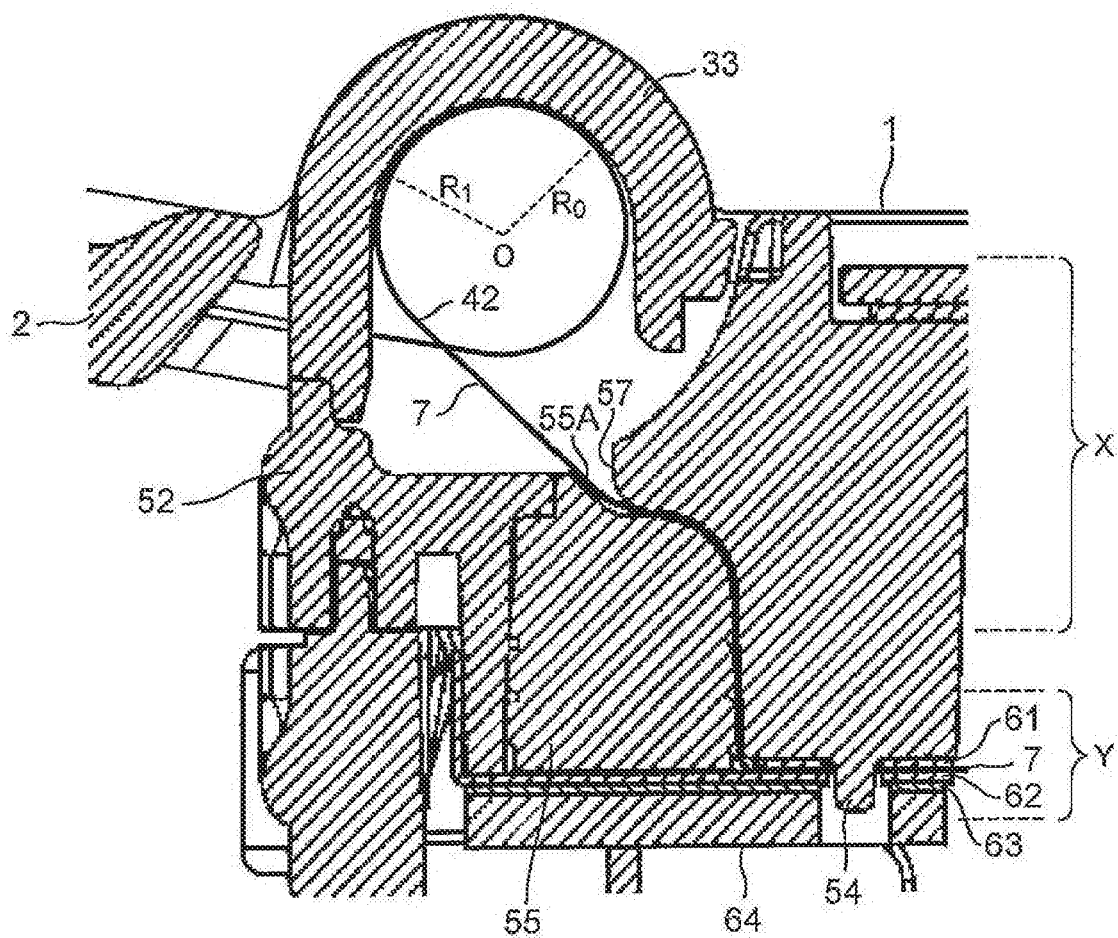
FIG. 11 is a sectional view, taken along the line A-A in FIG. 1, for describing a layout of a touch panel display and a circuit board in the first unit 1.

The press-fit portion 55 has an inclined portion 55A at its upper part. Inclination of the inclined portion 55 is provided so that an extended line 55C thereof conforms with a tangent line to a section of a cylinder formed by the space 35A. As shown in FIG. 11, when the handy terminal 100 is opened, an inclined surface of the inclined portion 55 may guide deformation of the flexible cable 7 so that the flexible cable 7 forms the arc along the inner wall surface of the cover 33. The inclined portion 55A has a lower end smoothly connected to a horizontal plane via a curved surface 55D.

Figure 9:
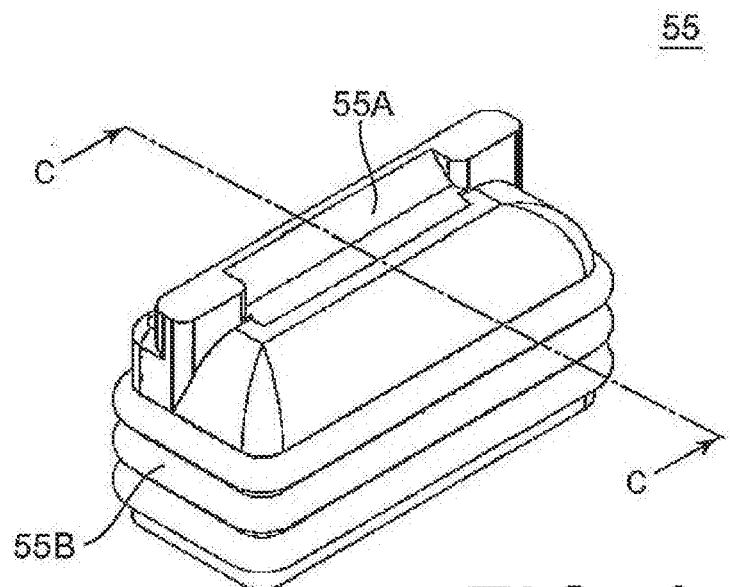
FIG. 9 is a perspective view of the press-fit portion 55.
Figure 10:
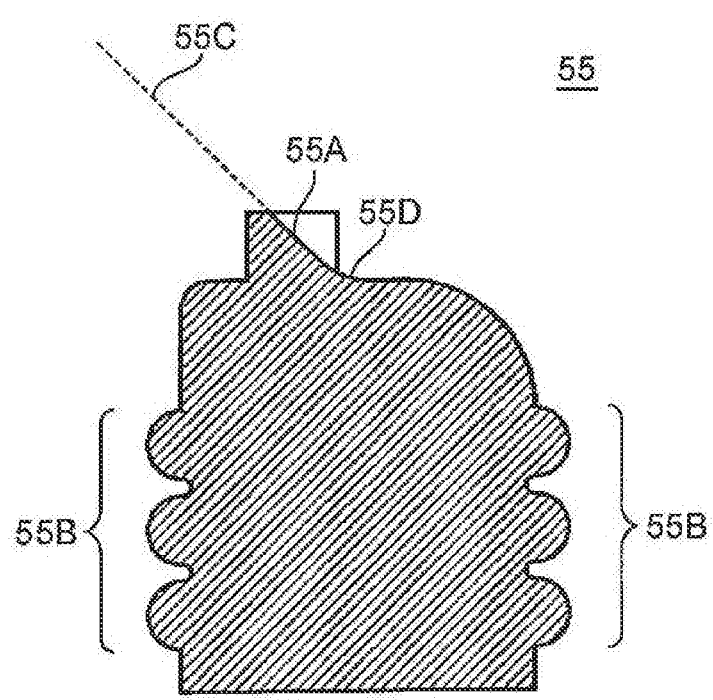
FIG. 10 is a sectional view of the press-fit portion 55, taken along a line C-C in FIG. 9.

As shown in FIGS. 9 and 10, a deformed portion 55B is formed along a side surface of the press-fit portion 55. When the press-fit portion 55 is press-fitted, the inclined portion 55A is disposed to face the space 35B. The deformed portion 55B is pressed against an inner wall surface of the first unit 1 that faces the space 53 and against an inner wall surface of the hinge bottom portion 52. Although not shown in the figure, the deformed portion 55B is pressed against inner wall surfaces faced thereto on a front side and a back side of a drawing sheet of FIG. 8. This prevents water leakage from the space 35B to the space 53.

As shown in FIG. 8, the flexible cable 7 is fixed at an innermost portion 56 of an inlet port to the first unit 1 in order to keep waterproofness but is not fixed at an inlet port to the second unit 2 because the key input portion 6 is sealed by the resin material to keep waterproofness.

After the press-fit portion 55 is press-fitted into the space 53, a double-sided tape 61 and a single-sided tape 62 are adhered to a lower part of the press-fit portion 55 as shown in FIG. 11 so that the press-fit portion 55 is supplementarily supported from the lower part. Furthermore, a double-sided tape 63 may be adhered under the single-sided tape 62 and a cushion 64 may be adhered thereto.

In the first unit 1, the touch panel display 4 is disposed in an area depicted by X in FIG. 11 and the circuit board is disposed in an area depicted by Y. Because the touch panel display 4 is disposed in the area X, the flexible cable 7 cannot be extracted from the winding portion 35 in a horizontal direction in the figure to be connected to the circuit board. Therefore, the flexible cable 7 is disposed along a route bypassing the area X to reach the area Y.

When the press-fit portion 55 is press-fitted into the space 53, the inclined portion 55A and the curved surface 55D of the press-fit portion 55 are faced to the first unit 1 to form a valley having a generally V-shaped section. As shown in FIG. 8, in inclined surfaces forming the valley having the generally V-shaped section, a valley inclined surface 57 of the first unit 1 is a curved surface. A valley inclined surface of the press-fit portion 55 that is formed by the inclined portion 55A and the curved surface 55D and the valley inclined surface 57 of the first unit 1 are open at an upper part and are narrowed at a lower part towards the innermost portion 56. As described above, the inclined portion 55A and the curved surface 55D of the press-fit portion 55 are made of, for example, rubber. On the other hand, the valley inclined surface 57 of the first unit 1 is formed by a resin component. In the space 53, a lower part below the innermost portion 56 is sealed by the press-fit portion 55, in particular, sealed by the deformed portion 55B formed on the side surface of the press-fit portion 55. Therefore, it is possible to prevent intrusion of water or the like to the lower part below the innermost portion 56.

Thus, the length of the flexible cable 7 is determined so that, inside the winding portion 35, the arc of the inverted S-shaped portion 42 is substantially inscribed in the cylindrical space 35A formed by the inner wall surface of the cover 33. In other words, the length of the flexible cable 7 is determined so that R0 is substantially equal to R1 or R1 is slightly shorter than R0 where R0 represents the radius of the cross-section of the cylindrical space 35A formed by the inner wall surface of the cover 33 and R1 represents the radius of the arc formed by the inverted S-shaped portion 42. As a result, the inverted S-shaped portion 42 forms a maximum arc which can be formed inside the winding portion 35.

Next, description will be made of a state of the flexible cable 7 in the winding portion 35 when the handy terminal 100 is closed. When the handy terminal 100 is closed, i.e., when the first unit 1 and the second unit 2 are closed, the arc formed by the inverted S-shaped portion 42 is minimized. In this event, a position of the arc formed by the inverted S-shaped portion 42 is not constant among individual products of the handy terminal 100 but may possibly be different depending on the individual products of the handy terminal 100.

Figure 12:
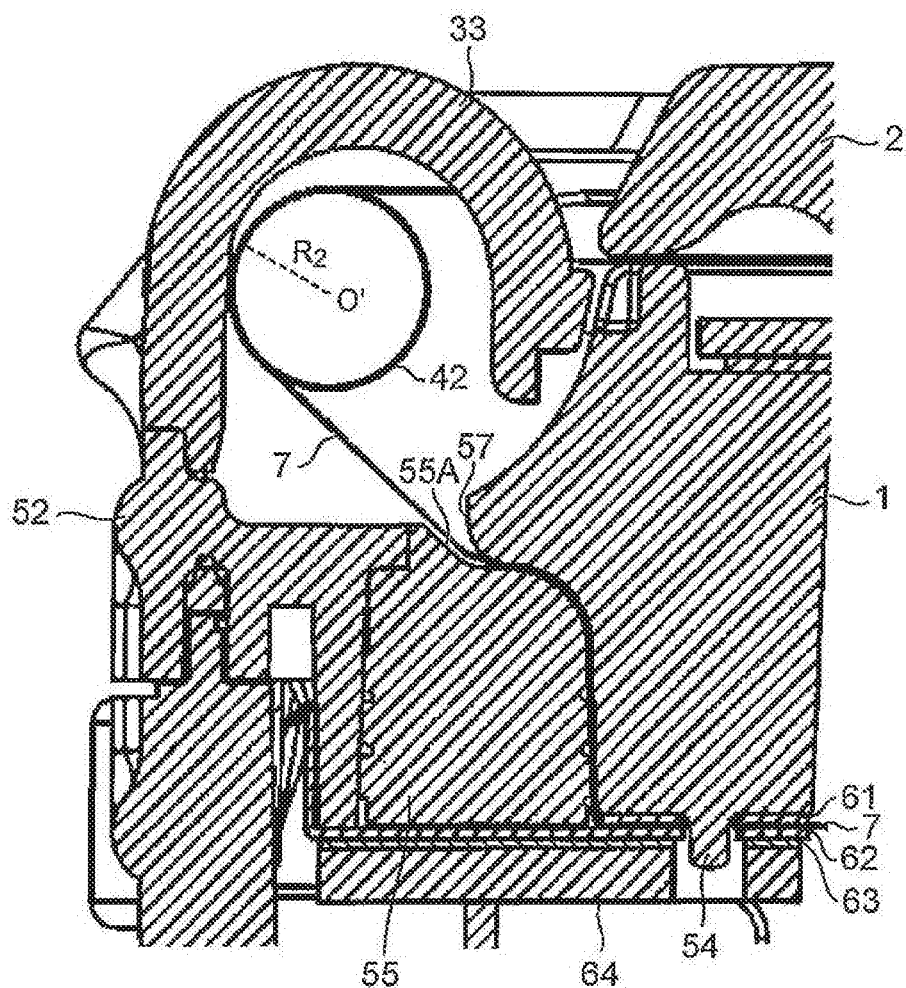
FIG. 12 is a view for describing a state of the flexible cable 7 in the winding portion 35 when the first unit 1 and the second unit 2 are closed, and is a sectional view corresponding to a cross-section taken along the line A-A in FIG. 1. An arc formed by an inverted S-shaped portion 42 is located at a leftmost position in the cover 33.
Figure 13:
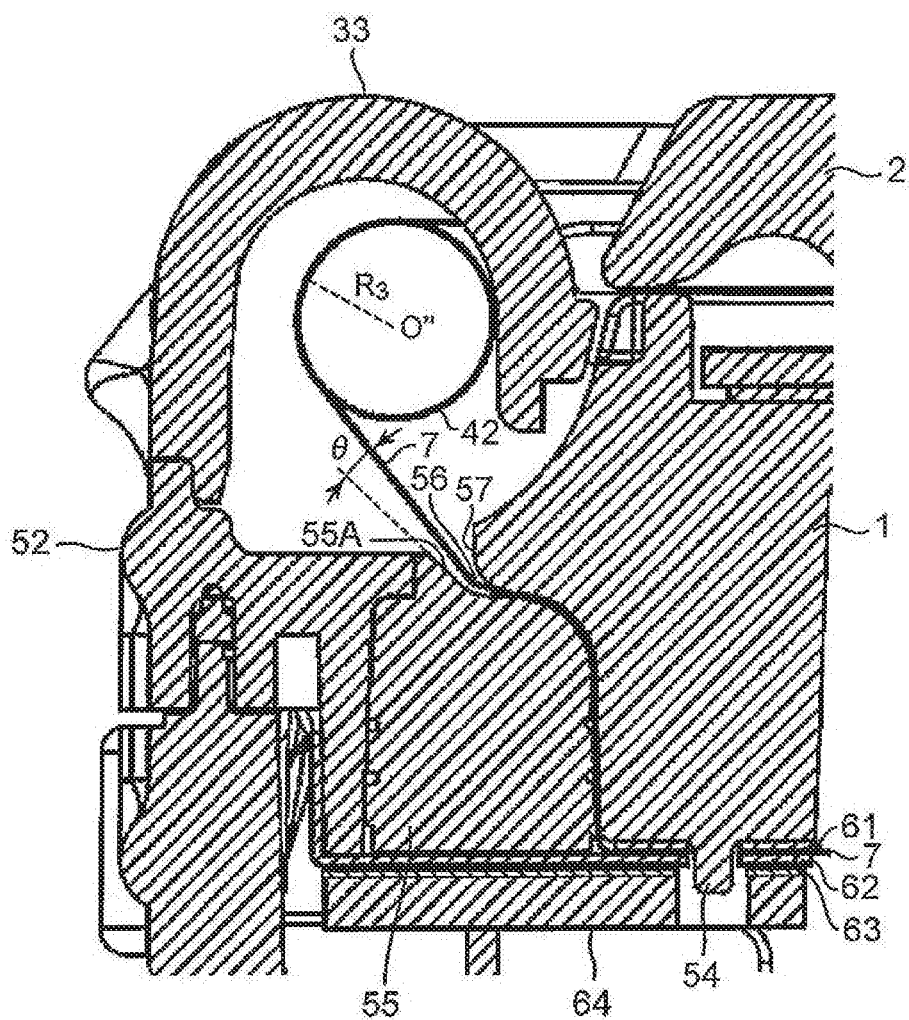
FIG. 13 is a view for describing a state of the flexible cable 7 in the winding portion 35 when the first unit 1 and the second unit 2 are closed, and is a sectional view corresponding to the cross-section taken along the line A-A in FIG. 1. The arc formed by the inverted S-shaped portion 42 is located at a rightmost position in the cover 33.

FIG. 12 shows a state where the inverted S-shaped portion 42 forms the arc at a leftmost position in the cover 33. In FIG. 12, the inverted S-shaped portion 42 draws an arc having a radius R2. Herein, R2<R1, R0. On the other hand, FIG. 13 shows a state where the inverted S-shaped portion 42 forms the arc at a rightmost position in the cover 33. In FIG. 13, the inverted S-shaped portion 42 draws an arc having a radius R3. Herein, R3<R1, R0.

As will be understood from comparison between FIG. 11 and FIG. 12, at the inlet port formed by the inclined portion 55A and the valley inclined surface 57, the flexible cable 7 extends along the inclined portion 55A. On the other hand, comparing FIG. 11 and FIG. 13, the flexible cable 7 is displaced towards the valley inclined surface 57 by an angle θ around the innermost portion 56 as a supporting point. As will be understood from the above, depending on the individual products of the handy terminal 100, the flexible cable 7 may possibly be subjected to repetitive stress around the innermost portion 56 as the supporting point when the first unit 1 and the second unit 2 are opened and closed.

However, as seen from FIGS. 11 to 13, the amount of displacement of the flexible cable 7 at the innermost portion 56 is small. In the case illustrated in FIG. 13, the arc is formed at the rightmost position and the amount of displacement in the closed state is maximum. In most cases, the amount of displacement of the flexible cable 7 at the innermost portion 56 is smaller than that in the case illustrated in FIG. 13.

Furthermore, attention will be focused on a direction of displacement of the flexible cable 7 when the handy terminal 100 is closed. In the case illustrated in FIG. 13, the flexible cable 7 is displaced clockwise around the innermost portion 56 as the supporting point. In the case illustrated in FIG. 12, the flexible cable 7 is not substantially displaced even if the handy terminal 100 is opened and closed. In any event, the flexible cable 7 is not displaced counterclockwise from the inclined portion 55A around the innermost portion 56 as the supporting point. An angular range of displacement of the flexible cable 7 around the innermost portion 56 as the supporting point, even at maximum, falls within a range from the inclined portion 55A to a position before the valley inclined surface 57.

As described above, in the handy terminal 100, not only the amount of displacement of the flexible cable 7 around the innermost portion 56 as the supporting point is small but also the angular range of displacement is limited. Therefore, breakage of the flexible cable 7 at the innermost portion 56, i.e., breakage of the flexible cable 7 at a fixed position with respect to the first unit 1 is difficult to occur.

(First Modification)

In the handy terminal 100 described above, attention is focused on breakage due to the displacement of the flexible cable 7 following opening and closing, i.e., the displacement of the flexible cable 7 around the innermost portion 56 as the supporting point. However, breakage of the flexible cable 7 occurs not only at the fixed position.

There is another kind of breakage resulting from intrusion of a viscous liquid (for example, soy sauce or sauce) into the winding portion 35. For example, as will be obvious from FIG. 11, when the handy terminal 100 is opened, the arc formed by the flexible cable 7 is widened and a large part thereof is brought into contact with the inner wall surface of the cover 33 or approaches an immediate vicinity thereof. Therefore, the viscous liquid intruding into the winding portion 35 may be adhered between to the flexible cable 7 and the covers 33 and 34.

It is assumed that the handy terminal 100 is tried to be closed in the state where such adhesion occurs. As particularly shown in FIGS. 11 to 13, when the handy terminal 100 is closed, the radius of the arc formed by the inverted S-shaped portion 42 becomes small. In presence of an adhered portion, that portion cannot move to a proper position when the arc becomes small. Therefore, the flexible cable 7 is bent at the adhered portion. Repetition of opening and closing in such adhered state may eventually result in breakage. In order to prevent occurrence of the adhesion, in the first modification, the flexible cable 7 is coated with a water repellent. As an example of the water repellent, a fluorine coating agent is known. However, a kind of the water repellent is not particularly limited. Furthermore, the water repellent may also have an oleophobic property in addition to a water-repellent property.

Figure 14:
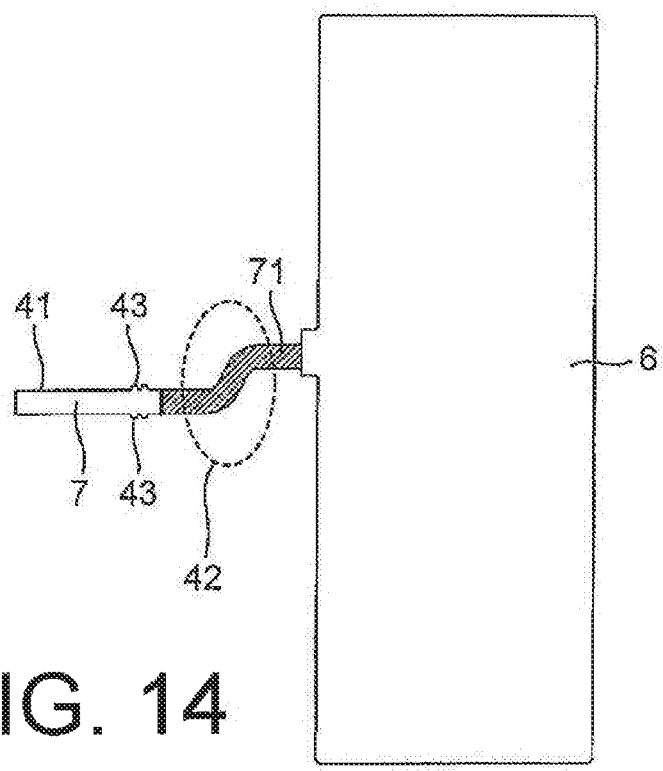
FIG. 14 is a plan view of the flexible cable 7 for describing a water repellent coated area 71 where the flexible cable 7 is coated with a water repellent in a first modification of the handy terminal 100.

The flexible cable 7 illustrated in FIG. 14 corresponds to a figure where the flexible cable 7 illustrated in FIG. 5 is seen from a back side of the drawing sheet. Therefore, the inverted S-shaped portion 42 draws an S shape in FIG. 14. A terminal of the terminal portion 41 is not seen because the terminal is located on the back side of the drawing sheet. As is different from FIG. 5, there is an area 71 coated with the water repellent. The water repellent coated area 71 is an area from a connecting portion between the flexible cable 7 and the key input portion 6 to a position before the positioning portion 43, including a back side of the inverted S-shaped portion 42.

When the flexible cable 7 is disposed in the handy terminal 100 and the inverted S-shaped portion 42 draws the arc inside the winding portion 35, the water repellent coated area 71 is located outside the arc, i.e., on a side faced to the covers 33 and 34. The water repellent coated area 71 may be applied also on the back side of the drawing sheet in FIG. 14 in addition to the front side of the drawing sheet.

Figure 15:
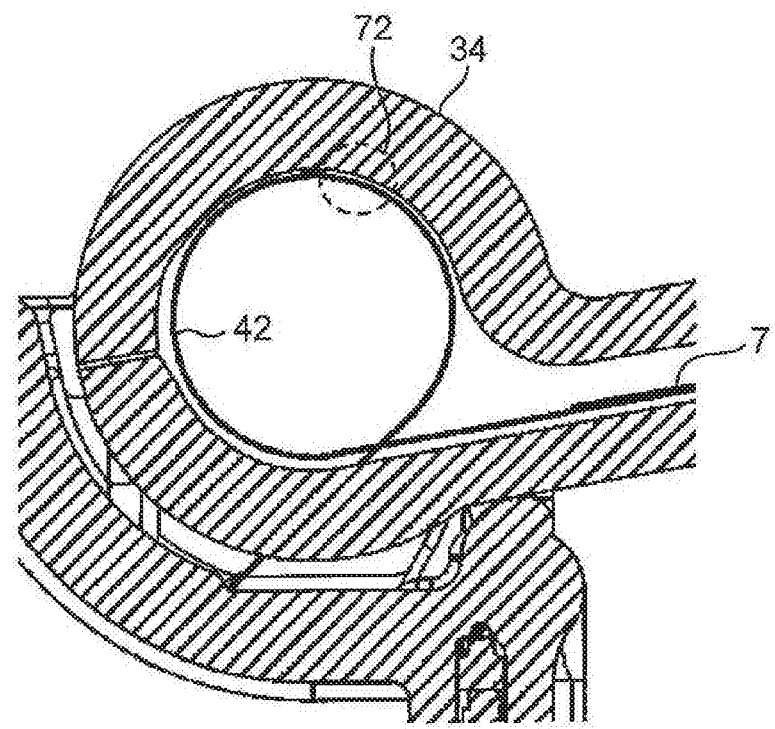
FIG. 15 is a view for describing an effect achieved by providing the water repellent coated area 71 in the first modification, and is a sectional view taken along a line B-B in FIG. 1. The handy terminal 100 is opened to the maximum.

It is assumed that the viscous liquid such as soy sauce or sauce intrudes to a point surrounded by a dotted circle in FIG. 15. Since the water repellent coated area 71 is formed in the first modification, the viscous liquid is not adhered to the flexible cable 7. Therefore, it is possible to prevent breakage of the flexible cable 7 resulting from adhesion of the flexible cable 7 to the inner wall surfaces of the covers 33 and 34 via the viscous liquid.

(Second Modification)

As shown in FIGS. 9 and 10, the handy terminal 100 has the press-fit portion 55. The press-fit portion 55 has a shape such that, when the handy terminal 100 is opened to the maximum, the extended line 55C extending along the cross-section of the inclined portion 55A conforms with the tangent line to the arc formed by the inverted S-shaped portion 42.

Referring to FIG. 10, in the press-fit portion 55, the inclined portion 55A is connected to a left end of the horizontal plane at the upper part of the press-fit portion 55 via a smooth curved surface. A right end of the horizontal plane is connected to the deformed portion 55B on a front side surface of the press-fit portion 55 via a smooth curved surface. Herein, a front side of the press-fit portion 55 is defined as a right-hand direction of a line C-C in FIG. 9 while a rear side is defined as a left-hand direction of the line C-C in the figure.

Figure 16:
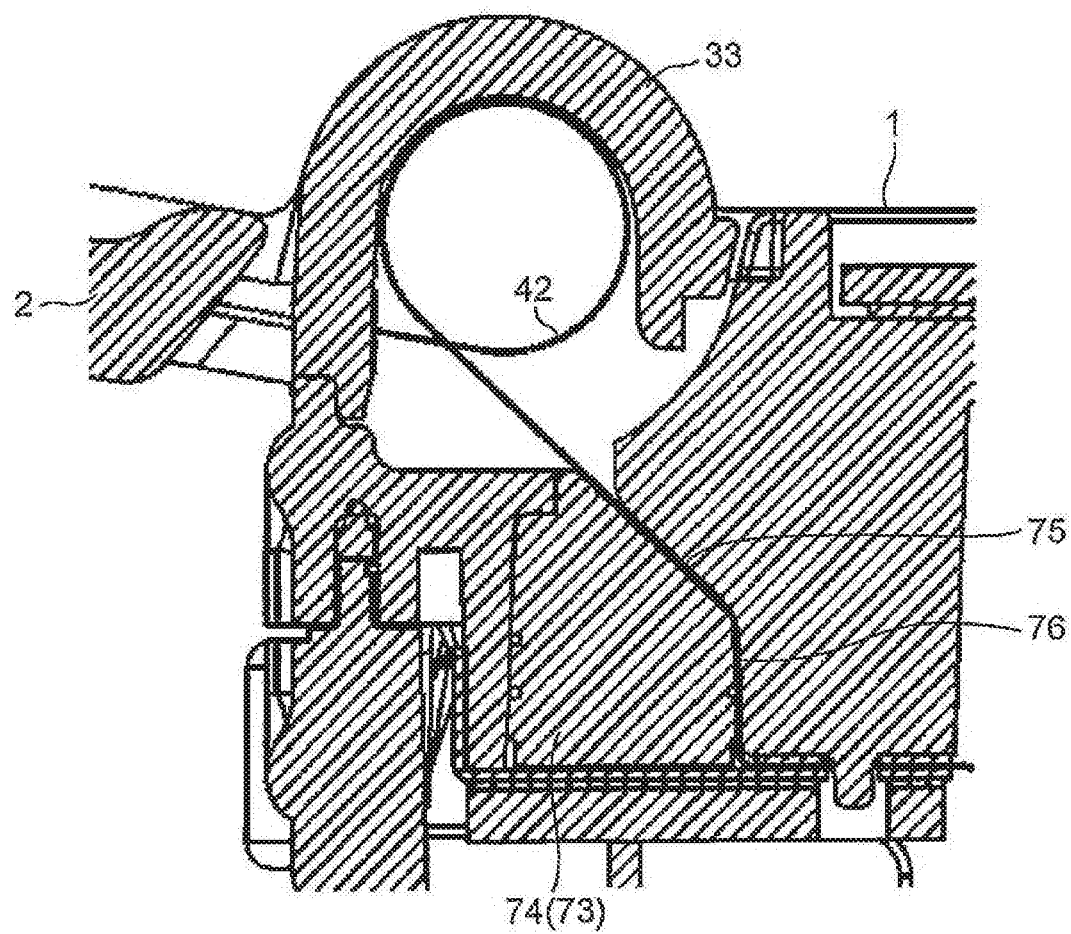
FIG. 16 is a view for describing a second modification of the handy terminal 100 which has a space 73 and a press-fit portion 74 instead of the space 53 and the press-fit portion 55, and is a sectional view taken along the line A-A in FIG. 1. The handy terminal 100 is opened to the maximum.

In the second modification of the handy terminal 100, a press-fit portion 74 illustrated in FIG. 16 is used instead of the press-fit portion 55. In the press-fit portion 74, an inclined portion 75 is connected to a deformed portion 76 on a front side surface while being kept along the tangent line to the arc formed by the inverted S-shaped portion 42. An inner wall surface defining the space 73 in the first unit 1 has a shape adapted to the press-fit portion 74 of the above-mentioned shape.

With either a combination of the space 53 and the press-fit portion 55 or a combination of the space 73 and the press-fit portion 74, the flexible cable 7 reaches the innermost portion of the inlet port to the first unit 1 along the tangent line to the arc formed by the inverted S-shaped portion 42. However, with the combination of the space 73 and the press-fit portion 74, the flexible cable 7 is disposed continuously along the tangent line to the arc by the inclined portion 75 after passing the innermost portion. Therefore, as compared with the combination of the space 53 and the press-fit portion 55, the combination of the space 73 and the press-fit portion 74 makes breakage of the flexible cable 7 further difficult to occur.

(Third Modification)

In the above-mentioned handy terminal 100, the flexible cable 7 has, on the side of the first unit 1, the terminal 41 removably connectable to the connector while an end portion on the side of the second unit 2 is integrally formed with the key input portion 6.

As described above, one end of the flexible cable 7 is removably connected to a destination device while the other end is fixedly connected to the destination device. Instead, the both ends of the flexible cable may be provided with removable terminals and the one end and the other end may be provided with positioning portions, respectively.

Figure 17:
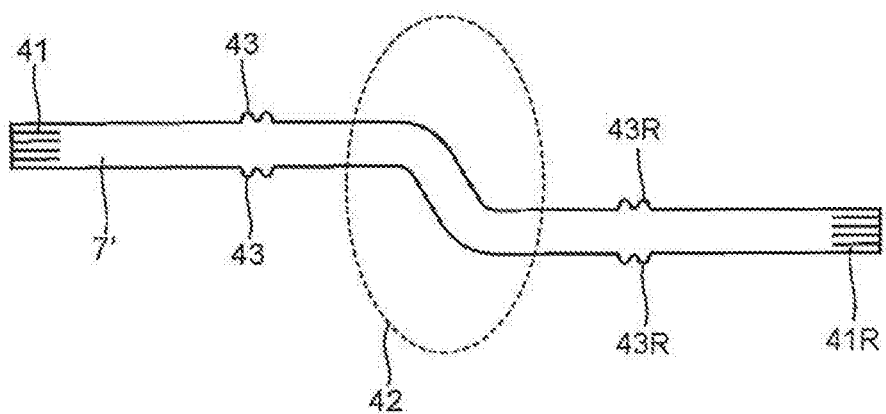
FIG. 17 is a plan view of the flexible cable 7 used in a third modification of the handy terminal 100.
Figure 18:
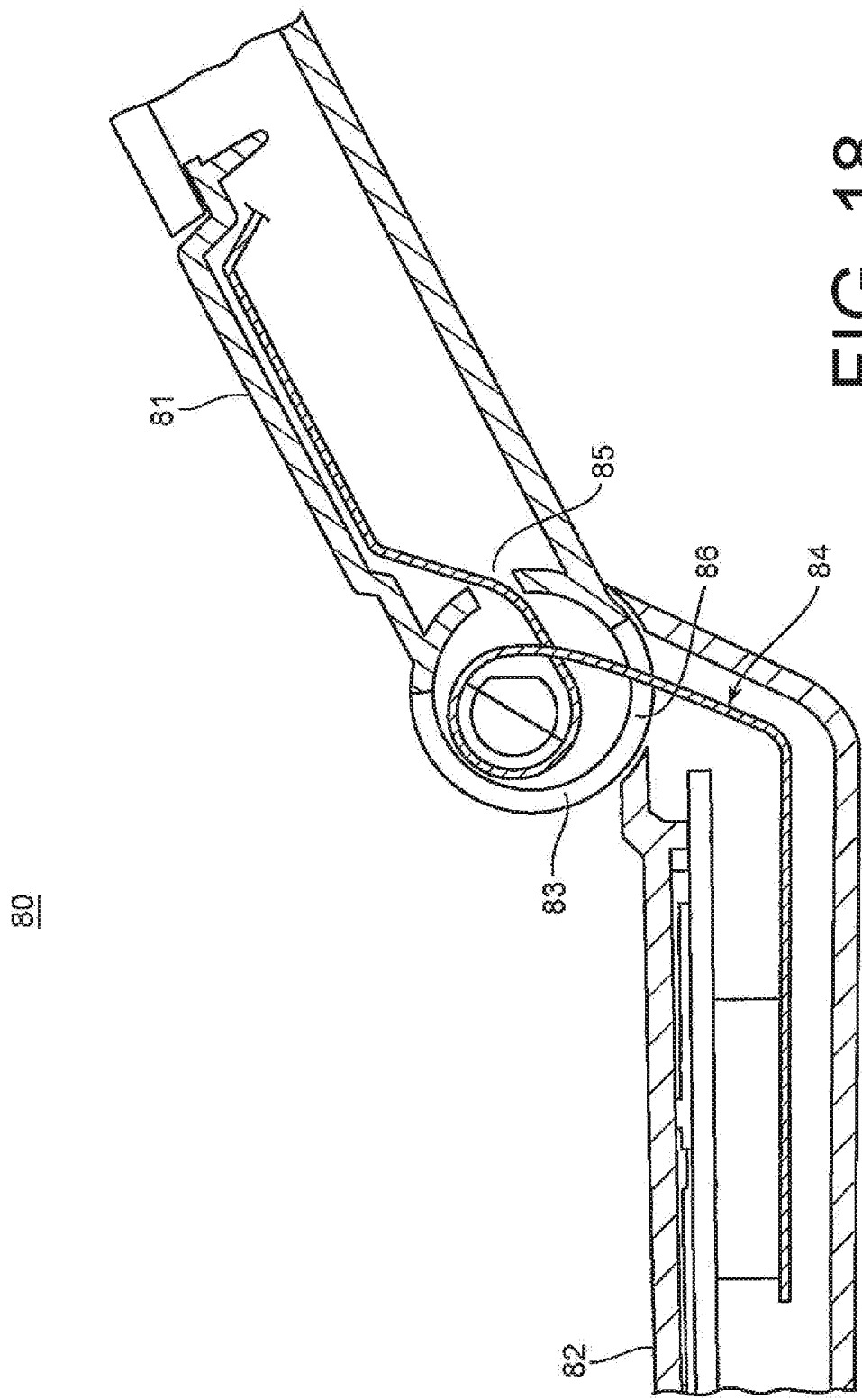
FIG. 18 is a sectional view for describing a mobile terminal device 80 in Patent Document 1.

In FIG. 17, a flexible cable 7' having terminals and positioning portions at both ends thereof is illustrated. The flexible cable 7' has the removable terminal 41 and the positioning portion 43 on a left side in the figure as seen from the inverted S-shaped portion 42. The flexible cable 7' further has a removable terminal 41R and a positioning portion 43R on a right side in the figure as seen from the inverted S-shaped portion 42.

(Fourth Modification)

In the first modification, the water repellent coated area 71 of the flexible cable 7 is coated with the water repellent. Instead of coating the flexible cable 7 or in addition to coating the flexible cable 7, the water repellent may be applied to the inner wall surfaces of the covers 33 and 34.

Although this invention has thus far been described in conjunction with the embodiment and the modifications thereof, this invention is not limited thereto. For example, although the handy terminal has been described as the embodiment of this invention and the modifications thereof, it would be obvious for a skilled person that this invention is widely applicable to any foldable device having a hinge mechanism. For example, the foldable device to which this invention is applicable includes, in addition to the handy terminal, a laptop computer having a liquid crystal display and a keyboard which are foldably connected to each other via a hinge and a foldable mobile telephone terminal.

A part or a whole of the above-mentioned embodiment may be described as the following supplementary notes, without being limited thereto.

(Supplementary Note 1)

A foldable device comprising a first unit, a second unit, a hinge portion, and a flexible cable, wherein:

the hinge portion rotatably connects the first unit and the second unit and the flexible cable electrically connects the first unit and the second unit;

at least a part of an inner wall surface of the hinge portion forms a part of a side surface of a columnar space having a section forming an arc of a radius R0; and the flexible cable forms an arc having a radius R1 substantially equal to the radius R0 when the first unit and the second unit are connected via the hinge portion in an open state.

(Supplementary Note 2)

The foldable device according to Supplementary Note 1, wherein the flexible cable has an S-shaped portion or an inverted S-shaped portion which forms an arc in the hinge portion.

(Supplementary Note 3)

The foldable device according to Supplementary Note 1 or 2, further comprising a press-fit portion made of an elastic material, at least one of the first unit and the second unit having a space for the press-fit portion to be press-fitted therein together with the flexible cable.

(Supplementary Note 4)

The foldable device according to Supplementary Note 3, wherein the press-fit portion has an inclined surface for guiding deformation of the flexible cable when the hinge portion is opened and closed.

(Supplementary Note 5)

The foldable device according to Supplementary Note 4, wherein, in the press-fit portion, the inclined surface is connected to a horizontal plane via a smooth curved surface and thereafter connected to a side surface of the press-fit portion via a smooth curved surface.

(Supplementary Note 6)

The foldable device according to Supplementary Note 4, wherein, in the press-fit portion, the inclined surface is directly connected to a side surface of the press-fit portion.

(Supplementary Note 7)

The foldable device according to any one of Supplementary Notes 1 to 6, wherein at least a part of the flexible cable and an inner wall surface of the hinge portion has an area coated with a water repellent.

(Supplementary Note 8)

A method of disposing a flexible cable in a foldable device comprising a first unit, a second unit, a hinge portion, and a flexible cable, wherein the hinge portion rotatably connects the first unit and the second unit and the flexible cable electrically connects the first unit and the second unit, the method including:

a stage in which at least a part of an inner wall surface of the hinge portion forms a part of a side surface of a columnar space having a section forming an arc of a radius R0; and a stage in which the flexible cable forms an arc having a radius R1 substantially equal to the radius R0 when the first unit and the second unit are connected via the hinge portion in an open state.

(Supplementary Note 9)

The method of disposing a flexible cable according to Supplementary Note 8, wherein the flexible cable has an S-shaped portion or an inverted S-shaped portion which forms an arc in the hinge portion.

(Supplementary Note 10)

The method of disposing a flexible cable according to Supplementary Note 8 or 9, wherein:

the foldable device has a press-fit portion made of an elastic material; and the method further includes a stage where, together with the flexible cable, the press-fit portion is press-fitted into a space of at least one of the first unit and the second unit.

(Supplementary Note 11)

The method of disposing a flexible cable according to Supplementary Note 10, including a stage in which, when the hinge portion is opened and closed, deformation of the flexible cable is guided by an inclined surface formed at the press-fit portion.

(Supplementary Note 12)

The method of disposing a flexible cable according to Supplementary Note 11, wherein, in the press-fit portion, the inclined surface is connected to a horizontal plane via a smooth curved surface and thereafter connected to a side surface of the press-fit portion via a smooth curved surface.

(Supplementary Note 13)

The method of disposing a flexible cable according to Supplementary Note 11, wherein, in the press-fit portion, the inclined surface is directly connected to a side surface of the press-fit portion.

(Supplementary Note 14)

The method of disposing a flexible cable according to any one of Supplementary Notes 8 to 13, comprising a step of coating at least a part of the flexible cable and an inner wall surface of the hinge portion with a water repellent.

(Supplementary Note 15)

A foldable device comprising a first unit, a second unit, a hinge portion, and a flexible cable, wherein the hinge portion rotatably connects the first unit and the second unit and the flexible cable electrically connects the first unit and the second unit, and the foldable device further comprises a press-fit portion made of an elastic material, at least one of the first unit and the second unit having a space for the press-fit portion to be press-fitted therein together with the flexible cable.

(Supplementary Note 16)

A method of disposing a flexible cable in a foldable device comprising a first unit, a second unit, a hinge portion, and a flexible cable, the hinge portion rotatably connecting the first unit and the second unit, the flexible cable electrically connecting the first unit and the second unit, wherein:

the foldable device has a press-fit portion made of an elastic material; and the method includes:

a stage in which the flexible cable forms an arc when the first unit and the second unit are connected to each other via the hinge portion in an open state; and a stage in which the press-fit portion is press-fitted together with the flexible cable into a space in at least one of the first unit and the second unit.

This application is based upon and claims the benefit of priority from Japanese Patent Application No. 2017-121104, filed on Jun. 21, 2017, the disclosure of which is incorporated herein in its entirety by reference.

EXPLANATION OF REFERENCE NUMERALS

1 first unit
2 second unit
3 hinge portion
4 touch panel display
5, 6 key input portion
7, 7' flexible cable
31, 32 hinge
33, 34 cover
35 winding portion
35A, 35B, 53, 73 space
41, 41R terminal portion
42 inverted S-shaped portion
43, 43R positioning portion
51 housing
52 hinge bottom portion
54 protrusion
55, 74 press-fit portion
55A, 75 inclined portion
55B, 76 deformed portion
55C extended line
55D curved surface
56 innermost portion
57 valley inclined surface
61, 63 double-sided tape
62 single-sided tape
64 cushion
71 water repellent coated area
72 dotted circle
100 handy terminal

What is claimed is:

1. A foldable device comprising a first unit, a second unit, a hinge portion, and a flexible cable, wherein:

the hinge portion rotatably connects the first unit and the second unit and the flexible cable electrically connects the first unit and the second unit;

at least a part of an inner wall surface of the hinge portion forms a part of a side surface of a columnar space having a section forming an arc of a radius $R0$; and the flexible cable forms an arc having a radius $R1$ substantially equal to the radius $R0$ when the first unit and the second unit are connected via the hinge portion in an open state, the foldable device comprises a press-fit portion made of an elastic material, at least one of the first unit and the second unit having a press-fit space at an opening connecting the inside and outside of the columnar space, the press-fit space being for the press-fit portion to be press-fitted therein together with the flexible cable so as to prevent water leakage via the press-fit space, wherein the press-fit portion has an inclined surface for guiding deformation of the flexible cable when the hinge portion is opened and closed.

2. The foldable device according to claim 1, wherein the press-fit portion comprises a deformed portion of a convex shape formed along a side surface of the press-fit portion, the deformed portion being deformed when press-fitted into the press-fit space.

3. The foldable device according to claim 1, wherein the flexible cable has an S-shaped portion or an inverted S-shaped portion which forms an arc in the hinge portion.

4. The foldable device according to claim 1, wherein, in the press-fit portion, the inclined surface is connected to a horizontal plane via a smooth curved surface and thereafter connected to a side surface of the press-fit portion via a smooth curved surface.

5. The foldable device according to claim 1, wherein, in the press-fit portion, the inclined surface is directly connected to a side surface of the press-fit portion.

6. The foldable device according to claim 1, wherein at least a part of the flexible cable and the inner wall surface of the hinge portion has an area coated with a water repellent.

7. A method of disposing a flexible cable in a foldable device comprising a first unit, a second unit, a hinge portion, a flexible cable, and a press-fit portion made of an elastic material, wherein the hinge portion rotatably connects the first unit and the second unit and the flexible cable electrically connects the first unit and the second unit, the method including:

a stage in which at least a part of an inner wall surface of the hinge portion forms a part of a side surface of a columnar space having a section forming an arc of a radius $R0$;

a stage in which the flexible cable forms an arc having a radius $R1$ substantially equal to the radius $R0$ when the first unit and the second unit are connected via the hinge portion in an open state; and a stage in which the press-fit portion is press-fitted, together with the flexible cable, in a press-fit space which at least one of the first unit and the second unit has and which is formed at an opening connecting the inside and outside of the columnar space so as to prevent water leakage via the press-fit space, wherein the press-fit portion has an inclined surface for guiding deformation of the flexible cable when the hinge portion is opened and closed.

8. The method of disposing the flexible cable according to claim 7, wherein the press-fit portion comprises a deformed portion of a convex shape formed along a side surface of the press-fit portion, the deformed portion being deformed when press-fitted into the press-fit space.

9. The method of disposing the flexible cable according to claim 7, wherein the flexible cable has an S-shaped portion or an inverted S-shaped portion which forms an arc in the hinge portion.

10. The method of disposing the flexible cable according to claim 7, wherein, in the press-fit portion, the inclined surface is connected to a horizontal plane via a smooth curved surface and thereafter connected to a side surface of the press-fit portion via a smooth curved surface.

11. The method of disposing the flexible cable according to claim 7, wherein, in the press-fit portion, the inclined surface is directly connected to a side surface of the press-fit portion.

12. The method of disposing the flexible cable according to claim 7, wherein at least a part of the flexible cable and the inner wall surface of the hinge portion has an area coated with a water repellent.

\* \* \* \* \*